United States Patent
Newman et al.

(10) Patent No.: US 6,983,438 B1
(45) Date of Patent: Jan. 3, 2006

(54) DESIGN TOOL FOR INTEGRATED CIRCUIT DESIGN

(75) Inventors: Robert Newman, Santa Clara, CA (US); Pranabendra Sarma, San Jose, CA (US); Valerie Vivares, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 352 days.

(21) Appl. No.: 09/643,847

(22) Filed: Aug. 23, 2000

(51) Int. Cl.
*G06F 17/50* (2006.01)

(52) U.S. Cl. .......................................................... 716/8
(58) Field of Classification Search ..................... 716/8
See application file for complete search history.

(56) References Cited

U.S. PATENT DOCUMENTS

| | | | |
|---|---|---|---|
| 5,424,248 A | 6/1995 | Doi | |
| 5,608,638 A * | 3/1997 | Tain et al. | 700/121 |
| 5,610,417 A | 3/1997 | Doi | |
| 5,675,179 A | 10/1997 | Shu et al. | |
| 5,684,332 A | 11/1997 | Chen et al. | |
| 5,742,079 A | 4/1998 | Doi | |
| 5,801,450 A | 9/1998 | Barrow | |
| 5,895,977 A | 4/1999 | Banerjee | |
| 6,041,269 A * | 3/2000 | Tain | 700/121 |
| 6,357,036 B1 * | 3/2002 | Eka et al. | 716/15 |
| 6,581,189 B1 * | 6/2003 | Tain | 716/3 |

* cited by examiner

*Primary Examiner*—Vuthe Siek
*Assistant Examiner*—Brandon Bowers

(57) ABSTRACT

A method and software relating to determining whether a square die fits into a package without generating drawings. Package parameters are defined and used to calculate die characteristics. Calculated die characteristics are compared to defined package parameters and/or to calculated package parameters to make a determination of whether a die with the calculated characteristics fits into a package as defined by its parameters. The method and software allow design of dies to fit packages, the design of packages to fit dies, and simultaneous design of dies and packages that fit one another.

18 Claims, 11 Drawing Sheets

BGA Main Worksheet

| | | SBGA | VBGA | |
|---|---|---|---|---|
| | Package Manufacture: | | | |
| 102 | Package Type: | SBGA | VBGA | |
| | In-line or Staggered? | | | —110 |
| | Posts in Arc or Straight line? | | | —112 |
| | Post Tip Radius (if Arc) [um] | | | —114 |
| | Max Wire Angle [degrees] | | | —116 |
| | Max Wire Length [mils] | | | —118 |
| | Min Substrate Post Pitch [um] | | | —120 |
| | Gap b/w Bonding Points on Rings [um] | | | —122 |
| | % Power and Ground Connections | | | —124 |
| | Die Pad Width [um] | | | —126 |
| | Min Die Corner Clearance [um] | | | —128 |
| | # of Corner Pads w/ different pitch (in each corner, per side) | | | —130 |
| | Corner Pad Pitch [um] | | | —132 |
| | Min Bond Pad Overlap [um] | | | —134 |
| | Post Width [um] | | | —136 |
| | Wire Diameter [mils] | | | —138 |
| | | Make-Graph | Make-Graph | |
| 104 | INPUT Pad Pitch [um]: | | | —140 |
| | Max Number of Connections per Side = | | | —142 |
| | Max Total Number of Wire Bond Connections = | | | —144 |
| | Min Die Edge Size [mm] = | | | —146 |
| 106 | INPUT Total Number of Wire Bond Connections: | | | —160 |
| | Min Die Pad Pitch [um] = | | | —162 |
| | Min Die Edge Size [mm] = | | | —164 |
| 108 | INPUT Die Edge Size [mm]: | | | —180 |
| | INPUT Die Pad Pitch [um]: | | | —182 |
| | INPUT Total Number of Wire Bond Pads (all bonded): | | | —184 |
| | MAX Total Number of Die Pads Allowed = | | | —190 |
| | Required Bond Finger Pitch [um] = | | | —192 |
| | Currently Possible to Manufacture? | | | —194 |

Fig. 1a

PQFP Main Worksheet

| | | | |
|---|---|---|---|
| *Package Manufacture:* | | | |
| *Package Type:* | PQFP | PQFP | |
| In-line or Staggered? | | | —210 |
| Conventional or Circular Frame? | | | —212 |
| Min Die Edge Size [mm] | | | —214 |
| Max Wire Angle [degrees] | | | —216 |
| Max Wire Length [mils] | | | —218 |
| Min Bond Finger Pitch [um] | | | —220 |
| Tie bar Width [mils] (for CIRCULAR FRAME ONLY; otherwise leave blank) | | | —222 |
| Bond Finger Gap Width [mils] | | | —224 |
| Die Pad Width [um] | | | —226 |
| Min Die Corner Clearance [um] | | | —228 |
| # of Corner Pads w/ different pitch (in each corner, per side) | | | —230 |
| Corner Pad Pitch [um] | | | —232 |
| Min Bond Pad Overlap [um] | | | —234 |
| Bond Finger Width [um] | | | —236 |
| Wire Diameter [mils] | | | —238 |
| | Make-Graph | Make-Graph | |
| INPUT Pad Pitch [um]: | | | —240 |
| Max Number of Connections per Side = | | | —242 |
| Max Total Number of Wire Bond Connections = | | | —244 |
| INPUT Total Number of Wire Bond Connections: | | | —260 |
| Min Die Pad Pitch [um] = | | | —262 |
| INPUT Die Pad Pitch [um]: | | | —280 |
| INPUT Total Number of Wire Bond Pads (all bonded): | | | —282 |
| MAX Total Number of Die Pads Allowed = | | | —290 |
| Required Bond Finger Pitch [um] = | | | —292 |
| Currently Possible to Manufacture? | | | —294 |

202, 204, 206, 208 label the row groups.

Fig. 2

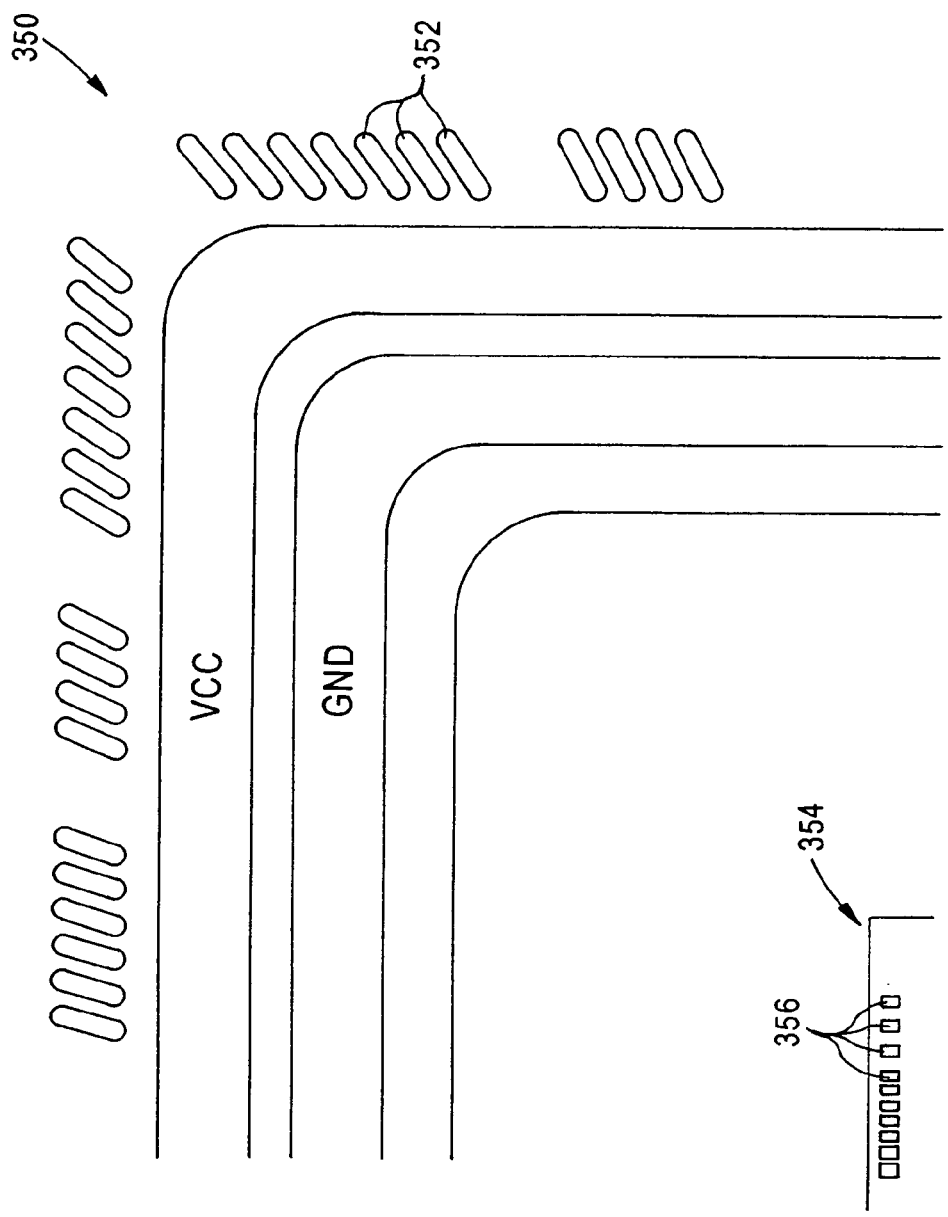
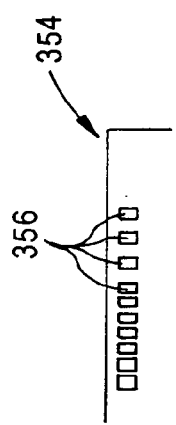
Fig. 3a
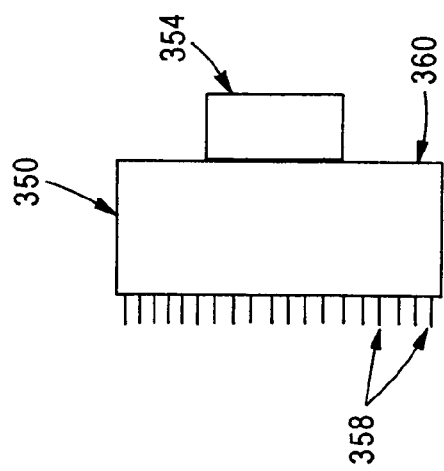
Fig. 3b

DESIGN TOOL FOR INTEGRATED CIRCUIT DESIGN

FIELD OF THE INVENTION

The present invention relates to designing integrated circuits, and in particular, to determining whether a particular die fits into a particular package.

DESCRIPTION OF RELATED ART

Integrated circuits are used to carry out a wide variety of tasks in many different electrical and electronic components. For these reasons, integrated circuit designs vary according to the function and environment that an integrated circuit is designed to operate in. Integrated circuits typically comprise a die attached to a package, often utilizing aluminized bond pads around the edge of the die and electroplated, e.g., gold over nickel over copper, post pads on the package. FIG. 3a depicts a die 354 on a package 350. Post pads 352 are part of the package 350, and provide electrical contacts on the upper surface 360 (FIG. 3b), for example via electrical connection to pins 358 (FIG. 3b) through the package 350, communicating to electrical components of which the package becomes a part. Bond pads 356 are part of the die 354, and provide electrical contact points for the electronics embedded in the die. Connecting the bond pads 356 to the post pads 352, for example using a wire (not shown), allows the electronics embedded in the die to communicate with the electrical components of which the package becomes a part.

Electrical connections are made between the bond pads and the post pads by a thin wire, usually of gold or aluminum, to connect the input/output regions of the die to the package, and to connect the die to the power and ground connections of the package. In a package design, the term "post pad pitch" refers to the distance from the center of one post pad to the center of a neighboring post pad, and the term "bond pad pitch" refers to the distance from the center of one bond pad to the center of a neighboring bond pad.

The wide variety of tasks that integrated circuits perform require new integrated circuit designs to constantly be made in order to create new and faster electronics. A challenging aspect of designing an integrated circuit is determining whether a die with a particular bond pad pitch fits into a particular package with a specified post pad pitch. Because of a need for electrical isolation, and because of physical design constraints, the bond pads on a die are limited as to how close they can be placed to one another. Correspondingly, the post pads on the package are also limited as to how close they may be placed to one another. The features and functions that a die performs dictate the number of input/output connections, power connections, and ground connections (collectively wire bond connections) that a die is going to make with a package. According to the number of wire bond connections required between the die and the package, a certain number of bond pads are formed along the edge of the die and a number of post pads, at least equal to the number of bond pads on the die that will be bonded, are placed on the package.

In order to determine whether a particular die fits into a particular package, several assumptions are made. A designer assumes aspects of the geometry of the die; for example, the length of one of the die's edges, the number of bond pads that can be placed on the die, and the pitch between the bond pads on the die. A designer must also assume a post pad pitch for the bonding pads that are part of the package. In order to determine whether a particular package fits into a particular die, a designer generates a computer drawing of the package and the die. Depending on the skill of the designer, several drawings of a package and die combination are made before a fit is found between a die and a package having the required number of bonded wire bonds. This process often requires three to four days to complete, and is therefore very time and resource consuming.

SUMMARY OF THE INVENTION

There is a need for reducing the time required to design a die and a package that fit with one another, and contain sufficient bonding and post pads to form the required number of wire bonds needed for the package and die to operate correctly. This need, and others, are addressed by the present invention, which evaluates whether a particular die fits into a particular package based on an input design parameter, without needing to generate any drawings. In one embodiment, a computer program, for example implemented on a spreadsheet, is configured to store a set of rules pertaining to packages and dies. The program is also configured to perform calculations that determine whether a die and package combination fits together after receiving inputs regarding the die and/or the package. Accordingly, one aspect of the invention relates to a method for determining whether a square die fits into a particular package. A design parameter for the square die is received as input, and is used to calculate characteristics of the die. The calculated die characteristics are then compared to characteristics of the package to determine whether a die with the calculated characteristics fits into the package.

Another aspect of the invention relates to a method for determining whether a particular square die fits into a particular ball grid array (BGA) package. An input for a die pad pitch is received, and is used to calculate die characteristics. Then, a maximum number of die pads allowed and a required package post pad pitch are calculated. Finally, whether a die with the input die pad pitch fits into a particular BGA package is determined by comparing the calculated required package post pad pitch, and a minimum pre-defined package post pad pitch for the BGA package.

In certain embodiments, the calculated die characteristics comprise a maximum number of wire bond connections per side of the die, a maximum number of wire bond connections for the die, and a minimum die edge length. In certain embodiments, the package post pads are staggered and arranged along an arc. In other embodiments, the package post pads are in-line and arranged along an arc. In other embodiments, the package post pads are staggered and arranged linearly. In yet other embodiments, the package post pads are in-line and arranged linearly.

Another aspect of the invention relates to determining whether a particular square die fits into a particular BGA package. A total number of wire bond connections is received as input, and used to calculate die characteristics. Then a maximum number of die pads allowed and a required package pad pitch are calculated using the calculated die characteristics. Finally, whether a die with the input total number of wire bond connections fits into a particular BGA package is determined by comparing a calculated required package pad pitch with a minimum pre-defined package pad pitch for the BGA package.

In certain embodiments, the calculated die characteristics comprise a minimum die pad pitch, and a minimum die edge length. In certain embodiments, determining whether a particular square die fits into a particular BGA package is performed for package post pads that are staggered and arranged along an arc. In other embodiments, determining whether a particular square die fits into a particular BGA package is performed for package post pads that are in-line and arranged along an arc. In still other embodiments, determining whether a particular square die fits into a particular BGA package is performed for package post pads that are staggered and arranged linearly. In yet other embodiments, determining whether a particular square die fits into a particular BGA package is performed for package post pads that are in-line and arranged linearly.

Another aspect of the invention relates to determining whether a particular square die fits into a particular plastic quad flat pack (PQFP) package. A die pad pitch is received as input, and is used to calculate die characteristics. Then, a maximum number of die pads allowed and a required package pad pitch are calculated. Finally, whether a die with the input die pad pitch fits into the particular PQFP package is determined by comparing the calculated required package pad pitch with a minimum pre-defined package pad pitch for the PQFP package.

In certain embodiments, the calculated die characteristics comprise a maximum number of wire bond connections per side of the die, and a maximum number of wire bond connections for the die. In certain embodiments, determining whether a particular square die fits into a particular package is performed for package post pads that are in-line and arranged circularly. In other embodiments, determining whether a particular square die fits into a particular package is performed for package post pads that are staggered and arranged circularly. In other embodiments, determining whether a particular square die fits into a particular package is performed for package post pads that are staggered and arranged conventionally. In yet other embodiments, determining whether a particular square die fits into a particular package is performed for package post pads that are in-line and arranged conventionally.

Yet another aspect of the present invention relates to whether a particular square die fits into a particular PQFP package. A total number of wire bond connections is received as input, and is used to calculate die characteristics. Then, a maximum number of die pads allowed and a required package pad pitch are calculated. Finally, whether a die with the input total number of wire bond connections fits into the particular PQFP package is determined by comparing the calculated required package pad pitch with a minimum pre-defined package pad pitch for the PQFP package. In certain embodiments, the calculated die characteristics comprise a minimum die pad pitch. In certain embodiments, determining whether a particular square die fits into a particular package is performed for package post pads that are in-line and arranged circularly. In other embodiments, determining whether a particular square die fits into a particular package is performed for package post pads that are staggered and arranged circularly. In other embodiments, determining whether a particular square die fits into a particular package is performed for package post pads that are staggered and arranged conventionally. In yet other embodiments, determining whether a particular square die fits into a particular package is performed for package post pads that are in-line and arranged conventionally.

BRIEF DESCRIPTION OF THE DRAWINGS

FIG. 1a depicts an embodiment of a spreadsheet programmed to carry out the present invention.

FIG. 2 depicts a second embodiment of a spreadsheet programmed to carry out the present invention.

FIG. 3a is a diagram illustrating package post pads and die bond pads.

FIG. 3b is a diagram illustrating a side view of a die attached to a package having pins.

DETAILED DESCRIPTION OF THE INVENTION

A methodology for determining whether a particular square die fits into a particular package is described. In the following description, for the purposes of explanation, numerous specific details are set forth in order to provide a thorough understanding of the present invention. It will be apparent, however, to one skilled in the art, that the present invention may be practiced without these specific details. In other instances, well-know structures and devices are shown in blocked-diagram form in order to avoid unnecessarily obscuring the present invention.

Present practices for designing new integrated circuits typically occupy three to four days, and involve generating seven or eight drawings to determine whether a particular die fits into a particular package. The present invention reduces preliminary design time to several minutes, and can be easily implemented as a spreadsheet tool.

Figure 1:
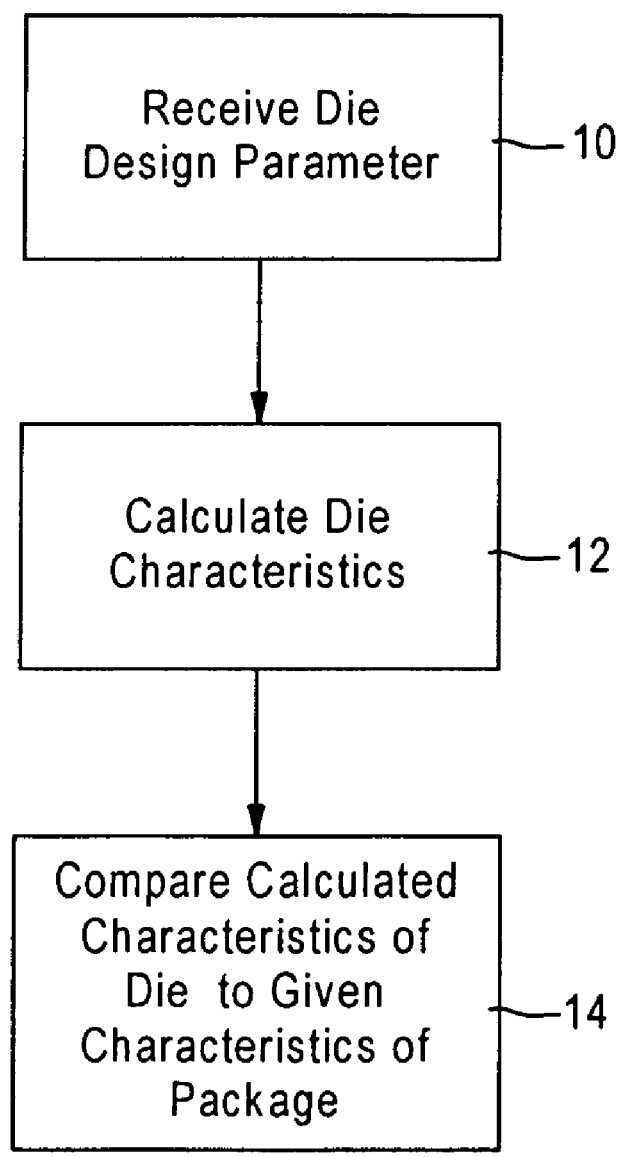
FIG. 1 depicts a flowchart of the processing performed by an embodiment of the present invention.

FIG. 1 depicts the processing flow of an embodiment of the present invention. In step 10, a design parameter for a square die is received as input. In step 12, the input design parameter is utilized to calculate characteristics of the die. In step 14, the calculated characteristics of the die are compared to pre-determined characteristics of the package in order to make a determination whether a die with the calculated characteristics fits into the package. Preferably, a spreadsheet is programmed to receive the input parameter and calculate whether a die fits into a particular package. The spreadsheet can also be used to match a package to a die, or for designing a package and a die.

BGA Design Parameters

Figure 5:
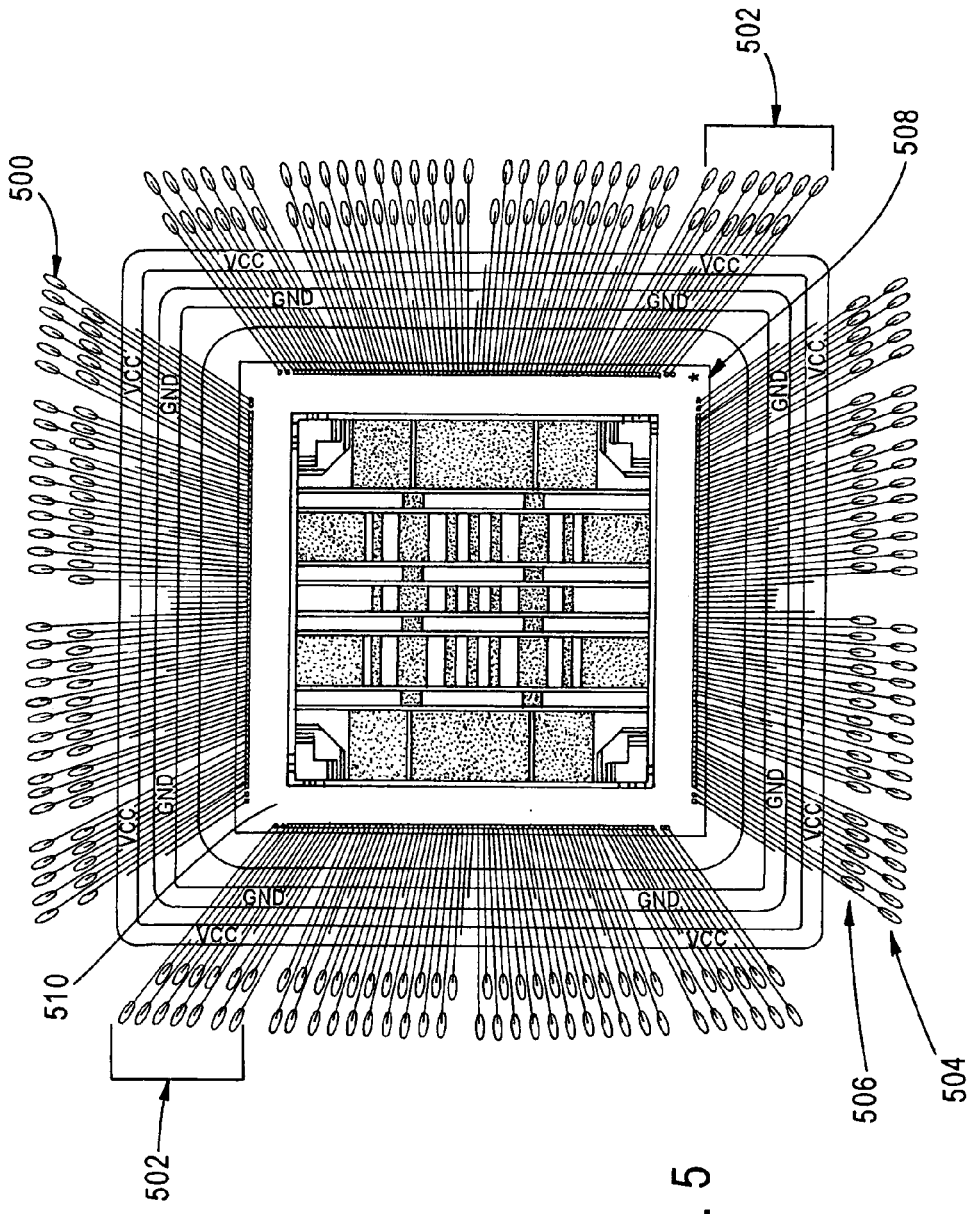
FIG. 5 depicts a BGA package having staggered package bonding pads arranged linearly.
Figure 6:
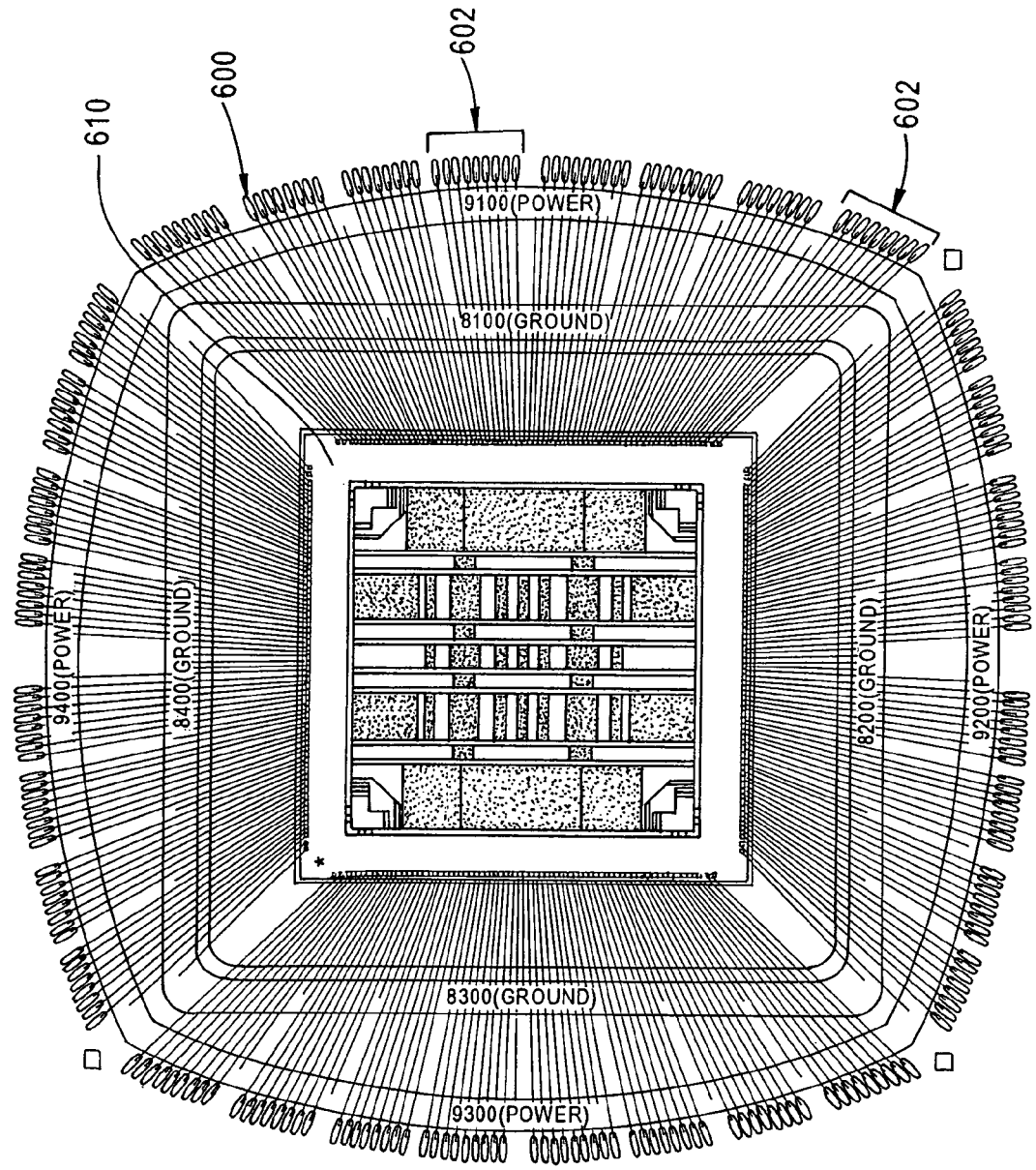
FIG. 6 depicts a BGA package having in line package post pads arranged in an arc.

In one embodiment, for step 10, several design parameters are input, using spreadsheet 100, depicted in FIG. 1a. The top portion 102 of the spreadsheet 100 contains parameters that define the package and die characteristics. These parameters are typically supplied by the manufacturer of the packages and dies, and are entered by the user into the spreadsheet. "In-line or staggered" 110 refers to the positioning of the package post pads. An example of in-line package post pads is illustrated in FIG. 6 where the post pads 600 have their centers substantially along a line for each group 602 of post pads 600. An example of staggered post pads is illustrated in FIG. 5 where each post pad 500 has its center off-set from the center of adjacent post pads 500 for each group 502 of post pads 500.

"Post in arc or straight line" 112 also refers to the positioning of the package post pads. In FIG. 5, the staggered package post pads 500 are arranged along a straight line. This straight line arrangement means that the center of each post pad 500 in the further row 504 from edge 508 of die 510 lies on a common line, and that the center of each post pad 500 in the closer row 506 to edge 508 of die 510 lies on a common line. If the post pads 500 were not staggered, but were in-line, then one common line would pass through the center of each post pad arranged along the edge 508 of die 510. The line or lines passing through the centers of the post pads 500 are substantially parallel to the edge 508 of die 510. In FIG. 6, the in-line package post pads 600 are arranged along an arc. This arc arrangement means that while the center of post pads 600 in a group 602 are substantially along a line, the centers of post pads 600 arranged off an edge of the die 610 all lie along a common arc. Although not shown, the in-line package post pads 600 of FIG. 6 could be staggered, as are the post pads 500 in FIG. 5, and still be arranged along the same arc as well as along a second arc concentric with the first arc.

Figure 3:
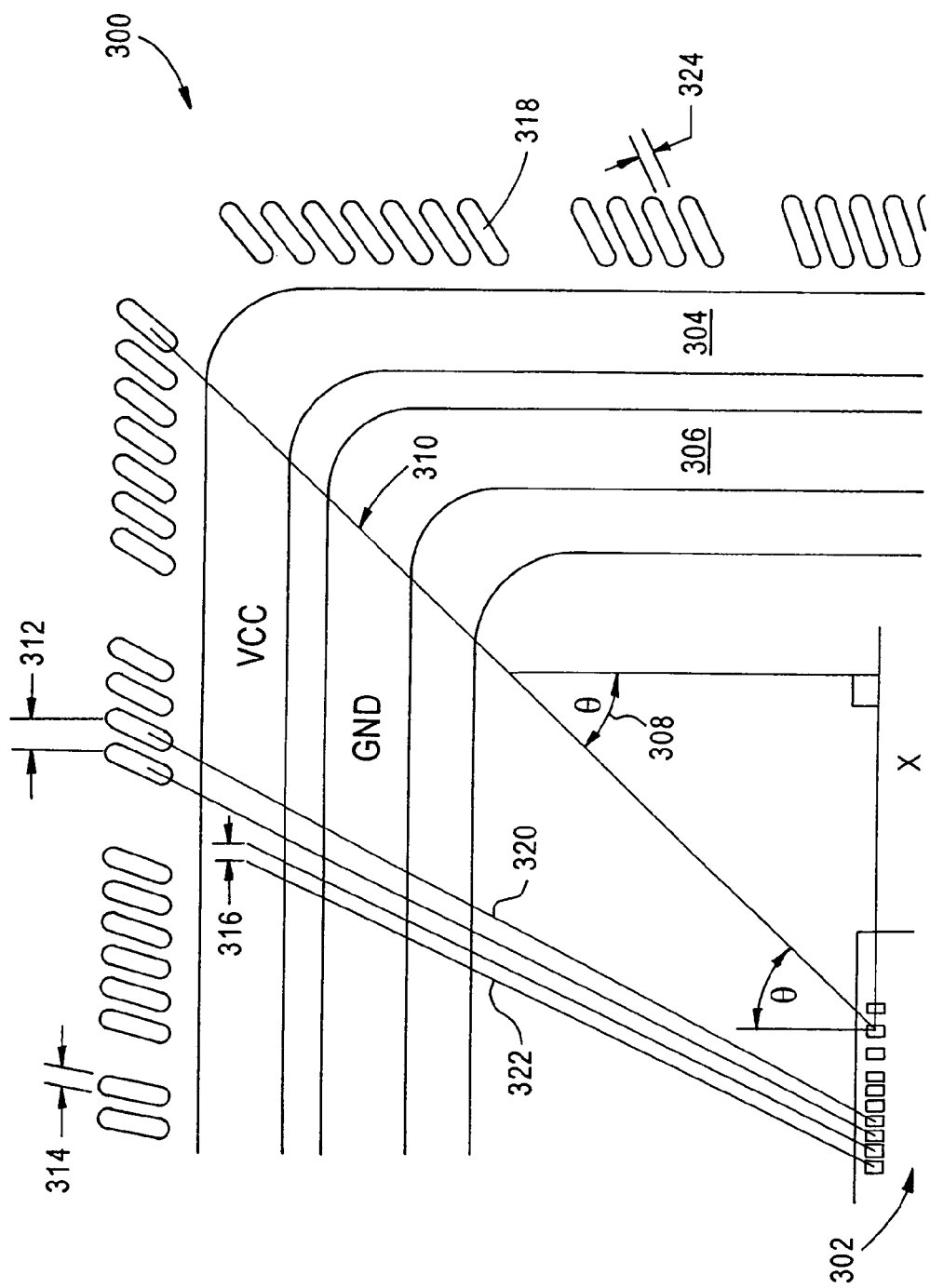
FIG. 3 is a diagram that illustrates various package parameters used with the present invention.
Figure 4:
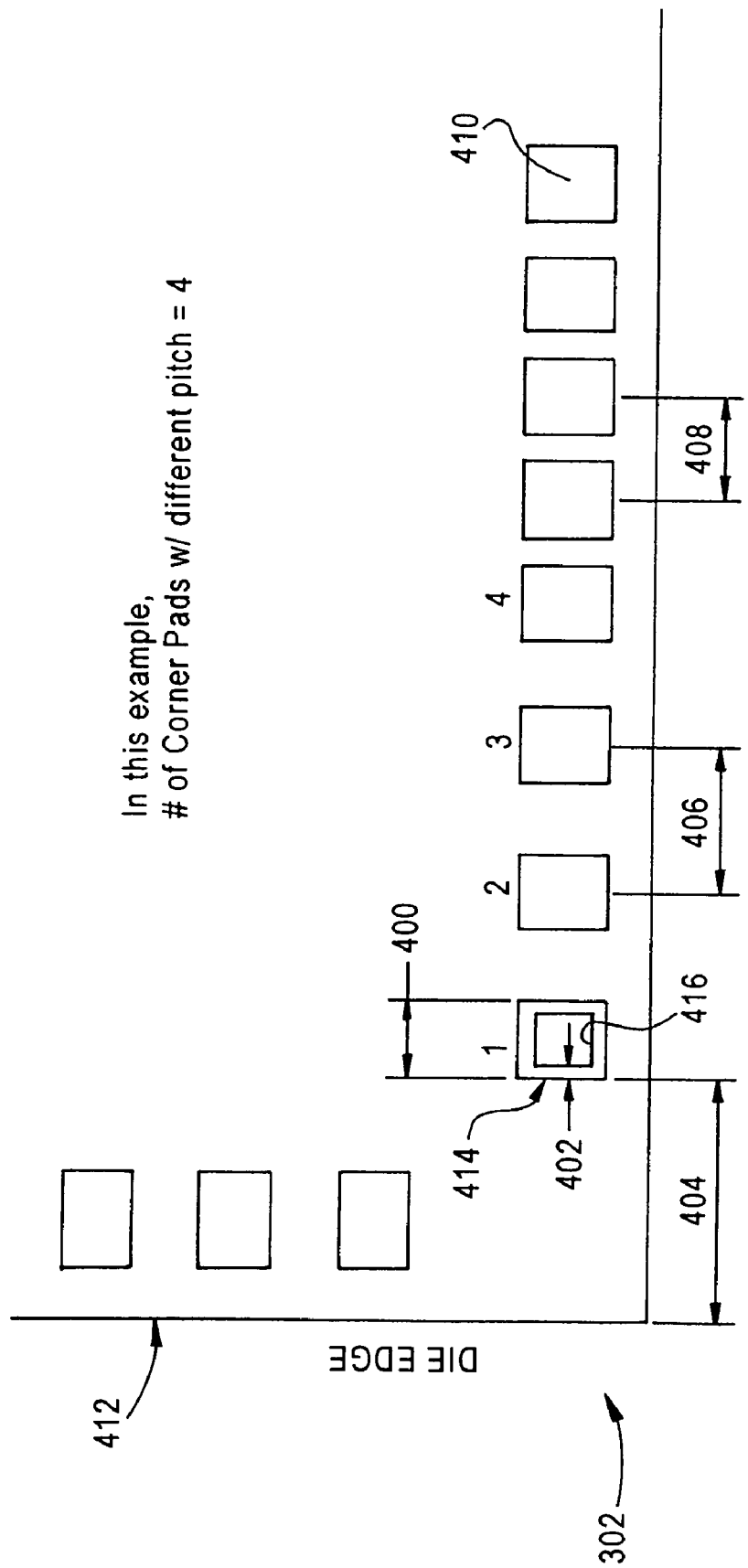
FIG. 4 is a diagram that illustrates various die parameters used with the present invention.

"Post-tip radius (if arc)" 114 refers to the radius from the center of the bond cavity, which is the center of the die-attach area, i.e., the inner-most rectangle in FIGS. 3 and 4, to the tip of the package post pads, if the package post pads are arranged along an arc, as depicted in FIG. 6.

"Max wire angle" 116 refers to the maximum angle that is permitted for a wire between a bond pad and a post pad. Referring to FIG. 3, the max wire angle 308 is depicted as angle θ. Generally, if θ exceeds 45 degrees then wires are likely to cross causing electrical shorts and other problems inhibiting the die 302 from operating properly with the package 300.

"Max wire length" 118 refers to the maximum length of a wire between a bond pad and a post pad that is permitted. The max wire length 310 is also depicted in FIG. 3, and is determined as the distance between a corner bond pad and a corner post pad. The maximum wire length is typically specified by the manufacturer of a package, and gives a wire length above which sagging of the wire may occur, causing a short circuit of something within the integrated circuit, or possible problems with carrying an electrical current.

"Min substrate post pitch" 120 refers to the minimum post pitch allowable for the post pads on a package. Min substrate post pitch is depicted in FIG. 3 as the center-point-to-center-point distance 312 between two post pads 318 on the package. This minimum distance is also specified by the package manufacturer.

"Gap between bonding points on rings" 122 refers to the distance of the bonding points on the ground and power rings on a package. Referring to FIG. 3, the gap between bonding points on the power and ground rings, 304 and 306 respectively, is depicted as the center point-to-center point distance between bonding points 318 on the power ring. Although not shown, the same gap between bonding points applies to bonding points on the ground ring and to adjacent bonding points where one is on the power ring 304 and the other is on the ground ring 306.

"Percent power and ground connections" 124 refers to the number of wire bond connections, for example, 322 on FIG. 3, from the die that are connected to the power and ground rings. This percentage varies depending upon the intended design of the integrated circuit. The remaining percentage of wire bond connections that are not connected to power and ground are for input/output connections, for example, 310, 320 on FIG. 3.

"Die pad width" 126 refers to the width of one of the bonding pads on the die. Referring to FIG. 4, the die pad width is depicted as the edge-to-edge distance 400 of one of the bond pads 410 on the die 302.

"Min die corner clearance" 128 refers to the minimum clearance between a bond pad on the die and the corner of the die itself. Referring to FIG. 4, the minimum die corner clearance 404 is depicted as the distance from the edge 412 of the die 302 to the closest edge 414 of the closest bonding pad 1.

"Number of corner pads with different pitch (in each corner, per side)" 130 refers to the number of bond pads on the die that have a pitch different from the standard pitch of the bond pads on the die. Referring to FIG. 4, it is seen that bond pads 1, 2, 3 and 4 have a different pitch than the other bond pads 410 depicted. In the example of FIG. 4, the number of corner pads with a different pitch is 4, and this number 4 is entered into the spreadsheet 100.

"Corner pad pitch" 132 refers to the pad pitch between the bond pads at the corner of the die. Referring to FIG. 4, corner pad pitch is the center-to-center distance 406 of the bonding pads 2 and 3 on the corner. The pitch between bonding pads 1, 2, 3 and 4 is the same, i.e., 406, whereas the pitch between bonding pads 4, 410 and between each bonding pad 410 is the same, i.e., 408.

"Min bond pad overlap" 134, "post width" 136, and "wire diameter" 138, are all optional parameters that may be provided. Bond pad overlap is depicted in FIG. 4 as the edge-to-edge distance 402 between a bond pad 416 and the aluminized bonding surface on which it sits. Post width is depicted in FIG. 3, and is the width 314 of one of the post pads 318 on the package 300. Wire diameter refers to the diameter of the wires that connect the bond pads with the post pads.

Calculating Die Characteristics for a BGA Package

The spreadsheet embodiment depicted in FIG. 1a is capable of three separate and independent sets of calculations, 104, 106, and 108. Depending upon what the designer is designing, any or all of the three sets of calculations are used to determine whether a square die fits into a package. Additionally, modifications to the package parameters defined in section 102 are modified to change the characteristics of the package itself.

A designer desiring to determine a maximum number of wire bond connections and a minimum die edge size utilizes the calculations performed in section 104. Inputting a pad pitch 140 (for the die) results in calculations of a maximum number of wire bond connections 144 and a minimum die edge size 146 for a die with the input pad pitch.

A designer desiring to determine a minimum die pad pitch and a minimum die edge size utilizes the calculations performed in section 106. Inputting a total number of wire bond connections 160 (for the die) results in calculations of a minimum die pad pitch 162 and a minimum die edge size 164 for a die with the input total number of wire bond connections 160.

If the designer further desires to determine whether a die with either the input pad pitch 140 or the input total number of wire bond connections 160 fits into a package as defined in section 102, the calculations in section 108 are utilized. If a die with an input pad pitch is considered, then the input pad pitch 140 is entered along with the calculated maximum total number of wire bond connections 144 and the calculated minimum die edge size 146 into section 108. Section 108 then calculates a maximum total number of die pads allowed 190, a required bond finger pitch 192 (which is the package post pad pitch), and determines 194 whether the die currently fits into the package defined by section 102. However, if a die with an input total number of wire bond connections is considered, then the input total number of wire bond connections 160 is entered along with the calculated minimum die pad pitch 162 and the calculated minimum die edge size 164 into section 108. Section 108 then calculates a maximum total number of die pads allowed 190, a required bond finger pitch 192 (which is the package post pad pitch), and determines 194 whether the die currently fits into the package defined by section 102.

In the set of calculations 104, when a die pad pitch is input 140, the spreadsheet 100 uses the input die pad pitch, as well as the package parameters from section 102, to calculate a maximum number of wire bond connections per side of the die 142, a maximum total number of wire bond connections for the die 144, and a minimum die edge length 146. These calculations are performed utilizing respective equations depending upon the arrangement of the post pads on the package.

For clarity, determining whether a square die fits into a particular package when package bond fingers, i.e., post pads, are arranged linearly and in-line is described in detail. The calculations utilized for different bond finger arrangements are then given later.

When the package post pads are in-line and arranged linearly an equation used to calculate the maximum number of connections for a side of the die 142 is:

$$2 \times \left[ \frac{2 \times MWL \times 25.4 \times \text{Sin}((\pi \times MWA) \div 180) +}{(MPP - (MPP - GBDP) \times CTPG) - IBPP} \right]$$

where:

MWL is the maximum wire length 118 (mils); MWA is the maximum wire angle 116 (degrees); CPWDP is the number of corner pads with different pitch 130; CPP is the corner pad pitch 132 ($\mu$m); IBPP is the input die bond pad pitch 140 ($\mu$m); MPP is the minimum post pitch 120 ($\mu$m); GBDP is the gap between bonding points on power and ground rings 122 ($\mu$m); and CTPG is the percentage of connections from the die to the power and ground rings 124. Truncating the result from this equation gives the maximum number of connections for a side of the die.

The maximum total number of wire bond connections for the die is calculated by multiplying the truncated result of the above equation by 4.

Calculating the minimum die edge size 146 for in-line package post pads is performed utilizing an equation:

$$\frac{2 \times MDCC + DPW + (CPWDP - 1) \times 2 \times CPP + (MNC - (CPWDP - 1) \times 2 - 1) \times IBPP}{1000}$$

where:

MDCC is the minimum die corner clearance 128 ($\mu$m); DPW is the die pad width 126 ($\mu$m); CPWDP is the number of corner pads with a different pitch 130; CPP is the corner pad pitch 132 ($\mu$m); MNC is the maximum number of connections per side of the die 142; and IBPP is the input die bond pad pitch 140 ($\mu$m).

If a designer wishes to determine whether a die with the input pad pitch fits into a package as defined by the parameters in section 102, the third set of calculations 108 is used.

Section 108 receives as inputs the calculated minimum die edge size 146, the previously input die pad pitch 140, and the calculated total number of wire bond pads on the die 144, all of which are bonded with a wire. Using these inputs and the package parameters in section 102, a maximum total number of die pads allowed 190, and the required bond finger pitch 192, i.e., the post pad pitch, are calculated. These calculations are performed utilizing different equations depending upon the arrangement of the post pads on the package.

When the package post pads are in-line and either arranged along an arc or linearly, an equation used to calculate the maximum total number of die pads allowed 190 is:

$$4 \times \left[ \frac{100 \times DEL - 2 \times MDCC - DPW - \frac{(CPWDP - 1) \times 2 \times CPP}{DPP}}{} + (CPWDP - 1) \times 2 + 1 \right]$$

where:

DEL is the die edge size 180 (mm); MDCC is the minimum die corner clearance 128 ($\mu$m); DPW is the die pad width 126 ($\mu$m); CPWDP is the number of corner pads with a different pitch 130; CPP is the corner pad pitch 132 ($\mu$m); and DPP is the die pad pitch 182 ($\mu$m). The portion in the square bracket is rounded to the nearest integer before being multiplied by 4.

When the package post pads are in-line and arranged linearly, an equation used to calculate the required bond finger pitch 192 is:

$$\frac{\left[ DPP + \frac{2 \times MWL \times 25.4 \times \text{Sin}\left(\frac{\pi \times MWA}{180}\right) + (CPWDP - 1) \times 2 \times CPP - \frac{DPP - Dpp \times (CPWDP - 1) \times 2}{\frac{WBP}{4}}}{} \right] - CTPG \times GBDP}{1 - CTPG}$$

where:

DPP is the die pad pitch 182 ($\mu$m); MWL is the maximum wire length 118 (mils); MWA is the maximum wire angle 116 (degrees); CPWDP is the number of corner pads with a different pitch 130; CPP is the corner pad pitch 132 ($\mu$m); CTPG is the percentage of connections from the die to the power and ground rings 124; GBDP is the gap between bonding points on the power and ground rings 122 ($\mu$m); and WBP is the total number of bonded wire bond pads 184.

A determination is then made whether it is currently possible to manufacture a die with the input pad pitch 140 to fit within a package, as defined by the parameters in section 102. The determination is made by comparing the calculated, required post pad pitch from section 108 to the "Min Substrate Post Pitch" 120 in section 102. The calculated, required bond finger, i.e., post pad, pitch 192 is rounded up to the nearest integer, e.g., if the calculated, required bond finger pitch 192 is 23.2 then it would be rounded to 24, before being compared to the "Min Substrate Post Pitch" 120. If the required bond finger pitch 192 is smaller than the "Min Substrate Post Pitch" 120 then an indication that it is not possible to manufacture a square die with the input pad pitch 140 so that it fits into the package described by the parameters in section 102 is made.

In the above manner, the calculations in section 104 are combined with the calculations in section 108 to discover the design parameters of a square die, and to determine whether the square die fits into a package as defined in section 102. In the second set of calculations 106, a total number of wire bond connections 160 is input. The spreadsheet 100 uses the input total number of wire bond connections 160, as well as the package parameters from section 102, to calculate a minimum die pad pitch 162 and a minimum die edge size 164. These calculations are performed utilizing different equations depending upon the arrangement of the post pads, i.e., bond fingers, on the package. Again, for clarity, only when the post pads are arranged linearly and in-line is described, with the calculations for other arrangements given later.

When the package post pads are in-line and arranged linearly, an equation used to calculate the minimum die pad pitch 162 is:

$$\frac{\frac{WBC}{4} \times (MPP - CTPG \times (MPP - GBDP)) - (CPWDP - 1) \times 2 \times CPP - 2 \times MWL \times 25.4 \times \text{Sine}\left(\frac{\pi \times MWA}{180}\right)}{\frac{WBC}{4} - (CPWDP - 1) \times 2 - 1}$$

where:

WBC is the total number of wire bond connections 160; MPP is the minimum post pitch 120 ($\mu$m); CTPG is the percentage of connections from the die to the power and ground rings 124; GBDP is the gap between bonding points on the power and ground rings 122 ($\mu$m); CPWDP is the number of corner pads with a different pitch 130; CPP is the corner pad pitch 132 (em); MWL is the maximum wire length 118 (mils); and MWA is the maximum wire angle 116 (degrees).

When the package post pads are in-line, an equation used to calculate the minimum die edge size 164 is:

$$\frac{2 \times MDCC + DPW + (CPWDP - 1) \times 2 \times CPP + \left(\frac{WBC}{4} - (CPWDP - 1) \times 2 - 1\right) \times MDPP}{1000}$$

where:

MDCC is the minimum die corner clearance 128 ($\mu$m); DPW is the die pad width 126 ($\mu$m); CPWDP is the number of corner pads with a different pitch 130; CPP is the corner pad pitch 132 ($\mu$m); WBC is the total number of wire bond connections 160; and MDPP is the minimum die pad pitch 162 ($\mu$m).

A determination is then made whether it is currently possible to manufacture a die with the input total number of wire bond connections 160 to fit within a package, as defined by the parameters in section 102. The determination is made by comparing the calculated, required post pad pitch from section 108 to the "Min Substrate Post Pitch" 120 in section 102. The calculated, required bond finger, i.e., post pad, pitch 192 is rounded up to the nearest integer, e.g., if the calculated, required bond finger pitch 192 is 23.2 then it would be rounded to 24, before being compared to the "Min Substrate Post Pitch" 120. If the required bond finger pitch 192 is smaller than the "Min Substrate Post Pitch" 120 then an indication that it is not possible to manufacture a square die with the input total number of wire bond connections 160 so that it fits into the package described by the parameters in section 102 is made.

In the above manner, the calculations in section 106 are combined with the calculations in section 108 to discover the design parameters of a square die, and to determine whether the square die fits into a package as defined in section 102.

Calculations for Alternative BGA Arrangements

As previously mentioned, other calculations may be employed depending on different BGA arrangements in section 104. These calculations are as follows:

When the package post pads are staggered and arranged along an arc an equation used to calculate the maximum number of connections for a side of the die 142 is:

$$\frac{2 \times \left(2 \times PTR \times \text{ArcSin}\left[\frac{2 \times MWL \times 25.4 \times \text{Sin}((\pi \times MWA) \div 180) + (CPWDP - 1) \times 2 \times CPP - IBPP - IBPP \times (CPWDP - 1) \times 2}{(MPP - (MPP - GBDP) \times CTPG) - IBPP} \times \frac{MPP - (MPP - GBDP) \times CTPG}{2 \times PTR}\right]\right)}{MPP - (MPP - GBDP) \times CTPG}$$

where:

PTR is the post tip radius relating to the pads on the package 114 ($\mu$m); MWL is the maximum wire length 118 (mils); MWA is the maximum wire angle 116 (degrees); CPWDP is the number of corner pads with different pitch 130; CPP is the corner pad pitch 132 ($\mu$m); IBPP is the input die bond pad pitch 140 (em); MPP is the minimum post pitch 120 ($\mu$m); GBDP is the gap between bonding points on power and ground rings 122 ($\mu$m); and CTPG is the percentage of connections from the die to the power and ground rings 124. Truncating the result from this equation gives the maximum number of connections for a side of the die.

When the package post pads are staggered and arranged linearly an equation used to calculate the maximum number of connections for a side of the die 142 is:

$$2 \times \left[\frac{2 \times MWL \times 25.4 \times \text{Sin}((\pi \times MWA) \div 180) + (CPWDP - 1) \times 2 \times CPP - IBPP - IBPP \times (CPWDP - 1) \times 2}{(MPP - (MPP - GBDP) \times CTPG) - IBPP}\right]$$

where:

MWL is the maximum wire length 118 (mils); MWA is the maximum wire angle 116 (degrees); CPWDP is the number of corner pads with different pitch 130; CPP is the corner pad pitch 132 ($\mu$m); IBPP is the input die bond pad pitch 140 ($\mu$m); MPP is the minimum post pitch 120 ($\mu$m); GBDP is the gap between bonding points on power and ground rings 122 ($\mu$m); and CTPG is the percentage of connections from the die to the power and ground rings 124. Truncating the result from this equation gives the maximum number of connections for a side of the die.

Calculating the minimum die edge size 146 for staggered package post pads is performed utilizing an equation:

$$\frac{2 \times MDCC + DPW + (CPWD - 1) \times 2 \times CPP + IBPP \times \frac{MNC - 2 \times CPWDP}{2}}{1000}$$

where:
MDCC is the minimum die corner clearance 128 ($\mu$m); DPW is the die pad width 126 ($\mu$m); CPWDP is the number of corner pads with a different pitch 130; CPP is the corner pad pitch 132 ($\mu$m); IBPP is the input die bond pad pitch 140 ($\mu$m); and MNC is the maximum number of connections per side of the die 142.

When the package post pads are in-line and arranged along an arc an equation used to calculate the maximum number of connections for a side of the die 142 is:

$$\left(\frac{2 \times PTR \times \text{ArcSin}\left[\frac{2 \times MWL \times 25.4 \times \text{Sin}((\pi \times MWA) \div 180) + (CPWDP - 1) \times 2 \times CPP - IBPP - IBPP \times (CPWDP - 1) \times 2}{(MPP - (MPP - GBDP) \times CTPG) - IBPP} \times \frac{MPP - (MPP - GBDP) \times CTPG}{2 \times PTR}\right]}{MPP - (MPP - GBDP) \times CTPG}\right)$$

where:
PTR is the post tip radius relating to the pads on the package 114 ($\mu$m); MWL is the maximum wire length 118 (mils); MWA is the maximum wire angle 116 (degrees); CPWDP is the number of corner pads with different pitch 130; and CPP is the corner pad pitch 132 ($\mu$m); MPP is the minimum post pitch 120 ($\mu$m); GBDP is the gap between bonding points on power and ground rings 122 ($\mu$m); CTPG is the percentage of connections from the die to the power and ground rings 124; and IBPP is the input die bond pad pitch 140 ($\mu$m). Truncating the result from this equation gives the maximum number of connections for a side of the die.

Other calculations performed in section 106 are as follows:

When the package post pads are staggered and arranged along an arc, an equation used to calculate the minimum die pad pitch 162 is:

PTR is the post tip radius 114 ($\mu$m); WBC is the total number of wire bond connections 160; MPP is the minimum post pitch 120 ($\mu$m); GBDP is the gap between bonding points on the power and ground rings 122 ($\mu$m); CTPG is the percentage of connections from the die to the power and ground rings 124; CPWDP is the number of corner pads with a different pitch 130; CPP is the corner pad pitch 132 (em); MWL is the maximum wire length 118 (mils); and MWA is the maximum wire angle 116 (degrees).

When the package post pads are staggered and arranged linearly, an equation used to calculate the minimum die pad pitch 162 is:

$$\frac{0.5 \times \frac{WBC}{4} \times (MPP - CTPG \times (MPP - GBDP)) - (CPWDP - 1) \times 2 \times CPP - 2 \times MWL \times 25.4 \times \text{Sin}\left(\frac{\pi \times MWA}{180}\right)}{0.5 \times \frac{WBC}{4} - (CPWDP - 1) \times 2 - 1}$$

where:
WBC is the total number of wire bond connections 160; MPP is the minimum post pitch 120 ($\mu$m); CTPG is the percentage of connections from the die to the power and ground rings 124; GBDP is the gap between bonding points on the power and ground rings 122 ($\mu$m); CPWDP is the number of corner pads with a different pitch 130; CPP is the corner pad pitch 132 ($\mu$m); MWL is the maximum wire length 118 (mils); and MWA is the maximum wire angle 116 (degrees).

When the package post pads are staggered, an equation used to calculate the minimum die edge size 164 is:

$$\frac{2 \times PTR \times \text{Sin}\left(\frac{0.5 \times WBC}{4} \times \frac{MPP - (MPP - GBDP) \times CTPG}{2 \times PTR}\right) - (CPWDP - 1) \times 2 \times CPP - 2 \times MWL \times 25.4 \times \text{Sin}\left(\frac{\pi \times MWA}{180}\right)}{\left(\left(0.5 \times \frac{WBC}{4} - (CPWDP - 1) \times 2 - 1\right) + 0.4185 \times \exp\left(0.0258 \times \frac{2 \times PTR \times \text{Sine}\left(0.5 \times \frac{WBC}{4} \times \frac{MPP - (MPP - GBDP) \times CTPG}{2 \times PTR}\right) - (CPWDP - 1) \times 2 \times CPP - 2 \times MWL \times 25.4 \times \text{Sin}\left(\frac{\pi \times MWA}{180}\right)}{0.5 \times \frac{WBC}{4} - (CPWDP - 1) \times 2 - 1}\right)\right)}$$

$$\frac{2 \times MDCC + DPW + (CPWDP - 1) \times 2 \times CPP + IBPP \times \frac{MNC - 2 \times CPWDP}{2}}{1000}$$

where:

MDCC is the minimum die corner clearance 128 ($\mu$m); DPW is the die pad width 126 ($\mu$m); CPWDP is the number of corner pads with a different pitch 130; CPP is the corner pad pitch 132 ($\mu$m); IBPP is the input die bond pad pitch 140 ($\mu$m); and MNC is the maximum number of connections per side of the die 142.

When the package post pads are in-line and arranged along an arc, an equation used to calculate the minimum die pad pitch 162 is:

$$\frac{2 \times PTR \times \mathrm{Sin}\left(\frac{WBC}{4} \times \frac{MPP - (MPP - GBDP) \times CTPG}{2 \times PTR}\right) - (CPWDP - 1) \times 2 \times CPP - 2 \times MWL \times 25.4 \times \mathrm{Sin}\left(\frac{\pi \times MWA}{180}\right)}{\left(\left(\frac{WBC}{4} - (CPWDP - 1) \times 2 - 1\right) + 0.4185 \times \exp\left(0.0258 \times \frac{2 \times PTR \times \mathrm{Sin}\left(\frac{WBC}{4} \times \frac{MPP - (MPP - GBDP) \times CTPG}{2 \times PTR}\right) - (CPWDP - 1) \times 2 \times CPP - 2 \times MWL \times 25.4 \times \mathrm{Sin}\left(\frac{\pi \times MWA}{180}\right)}{\frac{WBC}{4} - (CPWDP - 1) \times 2 - 1}\right)\right)}$$

where:

PTR is the post tip radius 114 ($\mu$m); WBC is the total number of wire bond connections 160; MPP is the minimum post pitch 120 ($\mu$m); GBDP is the gap between bonding points on the power and ground rings 122 ($\mu$m); CTPG is the percentage of connections from the die to the power and ground rings 124; CPWDP is the number of corner pads with a different pitch 130; CPP is the corner pad pitch 132 ($\mu$m); MWL is the maximum wire length 118 (mils); and MWA is the maximum wire angle 116 (degrees).

Other calculations performed in section 108 are as follows:

When the package post pads are staggered and either arranged along an arc or linearly, an equation used to calculate the maximum total number of die pads allowed 190 is:

$$4 \times \left[\frac{100 \times DEL - 2 \times MDCC - DPW - (CPWDP - 1) \times 2 \times CPP}{DPP}\right] \times 2 + 2 \times (CPWDP - 1) + 1$$

where:

DEL is the die edge size 146 (mm); MDCC is the minimum die corner clearance 128 ($\mu$m); DPW is the die pad width 126 ($\mu$m); CPWDP is the number of corner pads with a different pitch 130; CPP is the corner pad pitch 132 ($\mu$m); and DPP is the die pad pitch 182 ($\mu$m). The portion in the square bracket is rounded to the nearest integer before being multiplied by 4.

When the package post pads are staggered and arranged along an arc, an equation used to calculate the required bond finger pitch 192 is:

$$2 \times \left(\frac{2 \times PTR \times \mathrm{ArcSin}\left[\frac{2 \times MWL \times 25.4 \times \mathrm{Sin}\left(\frac{\pi \times MWA}{180}\right) + (CPWDP - 1) \times 2 \times CPP - DPP - DPP \times (CPWDP - 1) \times 2}{(MPP - (MPP - GBDP) \times CTPG) - DPP} \times \frac{MPP - (MPP - GBDP) \times CTPG}{2 \times PTR}\right]}{\frac{WBP}{4}}\right) - GPDP \times CTPG$$

where:

PTR is the post tip radius 114 (em); MWL is the maximum wire length 118 (mils); MWA is the maximum wire angle 116 (degrees); CPWDP is the number of corner pads with a different pitch 130; CPP is the corner pad pitch 132 ($\mu$m); DPP is the die pad pitch 182 ($\mu$m); MPP is the minimum post pitch 120 ($\mu$m); GBDP is the gap between bonding points on the power and ground rings 122 ($\mu$m); CTPG is the percentage of connections from the die to the power and ground rings 124; and WBP is the total number of bonded wire bond pads 184.

When the package post pads are in-line and arranged along an arc, an equation used to calculate the required bond finger pitch 192 is:

$$\frac{\left(2 \times PTR \times \text{ArcSin}\left[\frac{2 \times MWL \times 25.4 \times \text{Sin}\left(\frac{\pi \times MWA}{180}\right) + (CPWDP-1) \times 2 \times \frac{CPP-DPP-DPP \times (CPWDP-1) \times 2}{(MPP-(MPP-GBDP) \times CTPG)-DPP}}{\frac{WBP}{4}} \times \frac{MPP-(MPP-GBDP) \times CTPG}{2 \times PTR}\right] - GPDP \times CTPG\right)}{1-CTPG}$$

where:
- PTR is the post tip radius 1114 ($\mu$m); MWL is the maximum wire length 118 (mils); MWA is the maximum wire angle 116 (degrees); CPWDP is the number of corner pads with a different pitch 130; CPP is the corner pad pitch 132 ($\mu$m); DPP is the die pad pitch 182 ($\mu$m); MPP is the minimum post pitch 120 ($\mu$m); GBDP is the gap between bonding points on the power and ground rings 122 ($\mu$m); CTPG is the percentage of connections from the die to the power and ground rings 124; and WBP is the total number of bonded wire bond pads 184.

When the package post pads are staggered and arranged linearly, an equation used to calculate the required bond finger pitch 192 is:

$$\frac{\left[DPP + \frac{2 \times MWL \times 25.4 \times \text{Sin}\left(\frac{\pi \times MWA}{180}\right) + (CPWDP-1) \times 2 \times CPP - DPP - DPP \times (CPWDP-1) \times 2}{\frac{WBP}{6}}\right] - CTPG \times GBDP}{1-CTPG}$$

where:
- DPP is the die pad pitch 182 ($\mu$m); MWL is the maximum wire length 118 (mils); MWA is the maximum wire angle 116 (degrees); CPWDP is the number of corner pads with a different pitch 130; CPP is the corner pad pitch 132 ($\mu$m); CTPG is the percentage of connections from the die to the power and ground rings 124; GBDP is the gap between bonding points on the power and ground rings 122 ($\mu$m); and WBP is the total number of bonded wire bond pads 184.

PQFP Design Parameters

Figure 7:
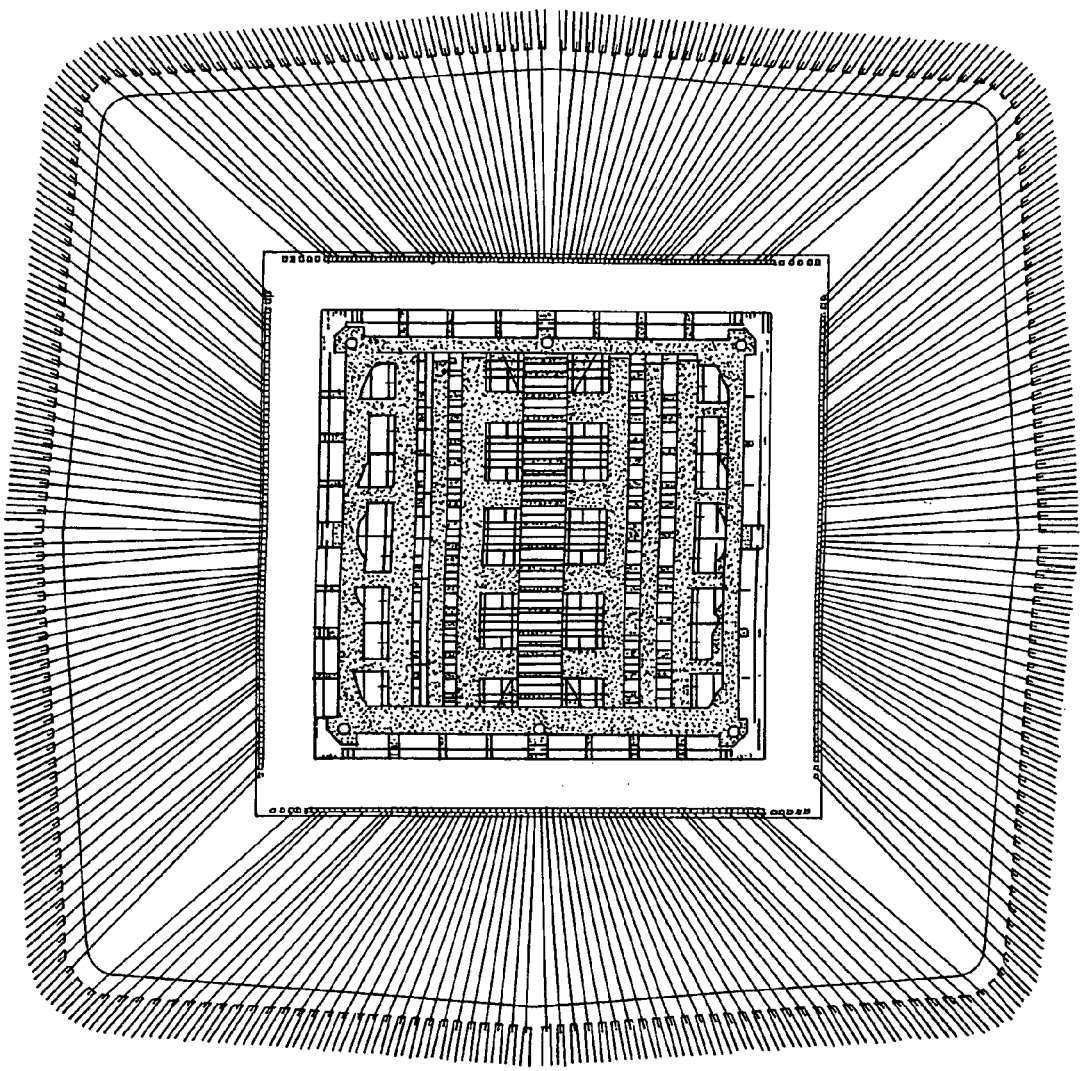
FIG. 7 depicts a conventional PQFP package having in line package post pads.
Figure 8:
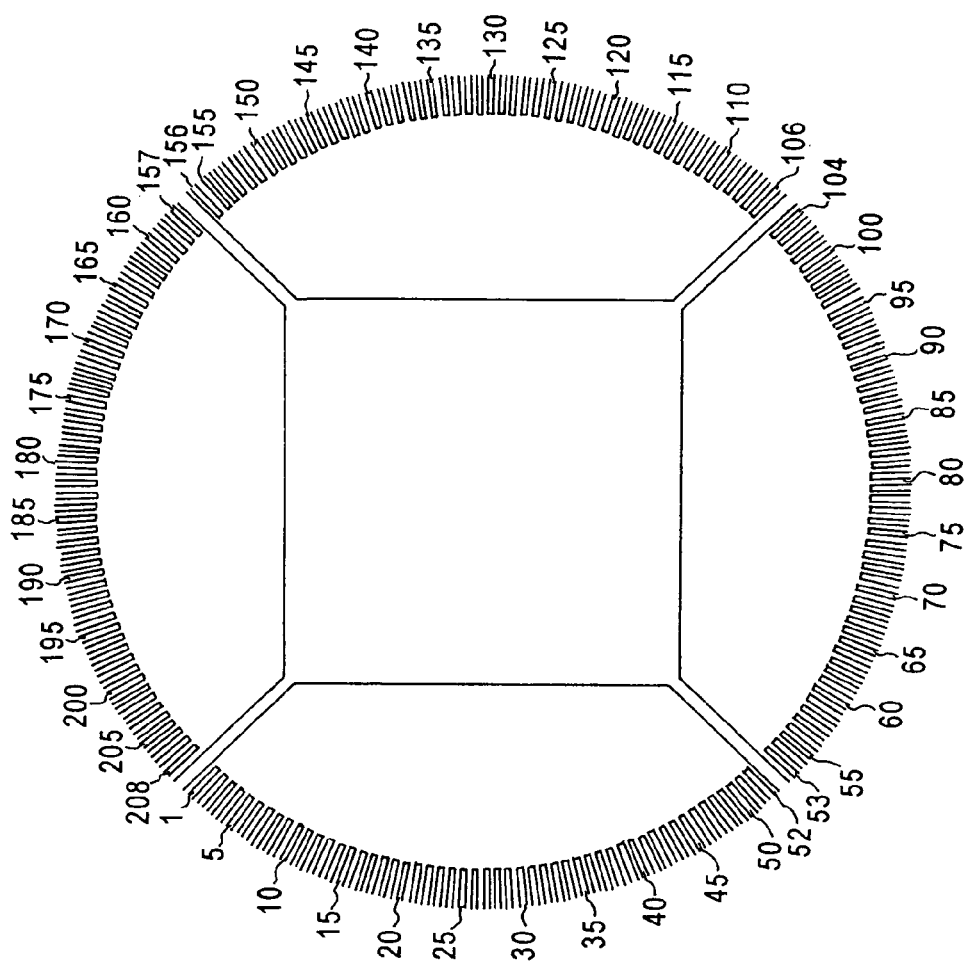
FIG. 8 depicts a circular PQFP package having in line package post pads.

FIG. 2 depicts an embodiment of a spreadsheet 200 for carrying out the present invention to determine whether a square die fits into a particular PQFP package. "In line or Staggered" 210, refers to the same design choice arrangement for the package post pads, as presented in FIG. 1a. "Conventional or circular frame" 212 refers to the type of PQFP frame that is used. A conventional PQFP frame is depicted in FIG. 7. A circular PQFP frame is depicted in FIG. 8, note that the leads from the die to the package post pads are not shown. "Min die edge size" 214 refers to the minimum length for an edge of the die. "Max wire angle" 216 is the same as max wire angle described in relation to FIG. 1a, as is "max wire length" 218. "Min bond finger pitch" 220 corresponds to min substrate post pitch, and is the distance between the center points of the post pads on the package. "Tie bar width" 222 refers to the width of the metal support structure in the four corners of the die attach pad and must be taken into account when calculating an arc of leads. "Bond finger gap width" 224 refers to the distance between edges of the post pads on the package, for example 324 between post pads 318 (FIG. 3). "Die pad width" 226, "min die corner clearance" 228, "number of corner pads with different pitch" 230, and "corner pad pitch" 232, all correspond to the same items related to FIG. 1a, and as depicted in FIG. 4. As related to FIG. 1a, "min bond pad overlap" 234, "bond finger width" 236, and "wire diameter" 238, are optional, and may be ignored in various embodiments.

Calculating Die Characteristics for a PQFP Package

As in FIG. 1a, three separate and independent sets of calculations are performed in the embodiment depicted in FIG. 2. In a similar fashion, the calculations may be utilized independently of one another, or either section 204 or section 206 may be combined with section 208 to calculate die parameters and determine whether a square die with the calculated parameters fits into a package as defined in section 202.

In the top set of calculations 204, a pad pitch 240 for the die is received as input. The input pad pitch 240, and the package parameters defined in section 202, are used to calculate a maximum number of wire bond connections per side of the die 242, and a maximum total number of wire bond connections for the die 244. Depending upon the arrangement of the package post pads different equations are used to calculate the maximum number of wire bond connections per side of the die and the maximum total number of wire bond connections for the die. Utilizing the spreadsheet embodiment in FIG. 2 is described relating to bond fingers arranged conventionally and in-line.

Calculations utilized for other bond finger arrangements are given later.

When the package post pads are in-line, an equation for calculating the maximum number of wire bond connections per side of the die 242 is:

$$\left[\frac{MDEL \times 1000 - 2 \times MDCC - DPW - 2 \times (CPWDP-1) \times CPP}{IDPP}\right] +$$
$$2 \times (CPWDP-1) + 1$$

where:
- MDEL is the minimum die edge size 214 (mm); MDCC is the minimum die corner clearance 228 ($\mu$m); DPW is the die pad width 226 ($\mu$m); CPWDP is the number of corner pads with a different pitch 230; CPP is the corner pad pitch 232 ($\mu$m); and IDPP is the input die pad pitch 240 ($\mu$m). The square bracket portion is truncated before being multiplied by 2.

The maximum number of wire bond connections for the die is calculated by multiplying the result from the preceding equation by 4.

As described above, the third set of calculations 208 is utilized to complete the design inquiry. The die pad pitch 240, as well as the calculated total number of wire bond connections 244 are input into the third set of calculations 208 in order to determine whether a square die with the input pad pitch 240 and the calculated total number of wire bond connections 244 fits into a package as defined in section 202. The third set of calculations 208 uses these two inputs, and the package parameters in section 202, to calculate a maximum total number of die pads allowed 290, a required bond finger (pad) pitch 292, and whether it is currently possible to manufacture a die 294 with the input pad pitch 240 into a package, as defined by the parameters in section 202.

When the package post pads are in-line, an equation for calculating the maximum number of die pads allowed 290 is:

$$4 \times \left( \left[ \frac{MDEL \times 1000 - 2 \times MDCC - DPW - 2 \times (CPWDP - 1) \times CPP}{IDPP} \right] + 2 \times (CPWDP - 1) + 1 \right)$$

and wherein the result from the equation in square brackets is truncated; and

MDEL is the minimum die edge size 214 (mm); MDCC is the minimum die corner clearance 228 ($\mu$m); DPW is the die pad width 226 ($\mu$m); CPWDP is the number of corner pads with a different pitch 230; CPP is the corner pad pitch 232 ($\mu$m); and IDPP is the input die pad pitch 280 ($\mu$m).

When the package post pads are in-line and arranged conventionally, an equation for calculating the required bond finger (pad) pitch 292 is:

$$IDPP + \left( \frac{2 \times MWL \times 25.4 \times \text{Sine}((\pi \times MWA) \div 180) + (CPWDP - 1) \times 2 \times CPP - IDPP - IDPP \times (CPWDP - 1 \times 2)}{(TNWBP \div 4)} \right)$$

and where:

IDPP is the input die pad pitch 280 ($\mu$m); MWL is the maximum wire length 218 (mils); MWA is the maximum wire angle 216 (degrees); CPWDP is the number of corner pads with a different pitch 230; CPP is the corner pad pitch 232 ($\mu$m); and TNWBP is the total number of wire bond pads 282.

The determination whether a die with the input pad pitch 240 fits into the package described by section 202 is made in the same manner as described in relation to FIG. 1a by comparing the required bond finger (i.e., the package post pad) pitch 292 to the "Min Bond Finger Pitch" 220 given in section 202.

The set of calculations 206 are also used to calculate a die parameter, however a total number of wire bond connections is input instead of a bond pad pitch. The input total number of wire bond connections 260, and the package parameters in section 202, are used to calculate a minimum die pad pitch 262. Depending upon the arrangement of the package post pads two different equations are utilized to calculate the minimum die pad pitch.

When the package post pads are in-line, an equation used to calculate the minimum die pad pitch 262 is:

$$\left[ \frac{MDEL \times 1000 - 2 \times MDCC - DPW - 2 \times (CPWDP - 1) \times CPP}{(TNWBC \div 4) - 1 - 2 \times (CPWDP - 1)} \right]$$

where:

MDEL is the minimum die edge size 214 (mm); MDCC is the minimum die corner clearance 228 ($\mu$m); DPW is the die pad width 226 ($\mu$m); CPWDP is the number of corner pads with a different pitch 230; CPP is the corner pad pitch 232 ($\mu$m); and TNWBC is the total number of wire bond connections 260.

The calculated die pad pitch 262 and the total number of wire bond connections 260 are then input into the third set of calculations 208, as described supra, to calculate a maximum total number of die pads allowed 290, a required bond finger pitch 292, and whether it is currently possible to manufacture 294 a die having the total number of wire bond connections 260 and the calculated minimum die pad pitch 262 within an existing package, is made.

Calculations for Alternative PQFP Arrangements

As previously mentioned, other calculations may be employed depending on different PQFP arrangements in section 204. These calculations are as follows:

When the package post pads are staggered, an equation for calculating the maximum number of wire bond connections per side of the die 242 is:

$$\left[ \frac{MDEL \times 1000 - 2 \times MDCC - DPW - 2 \times (CPWDP - 1) \times CPP}{IDPP} \right] \times 2 + 2 \times (CPWDP - 1) + 1$$

where:

MDEL is the minimum die edge size 214 (mm); MDCC is the minimum die corner clearance 228 ($\mu$m); DPW is the die pad width 226 ($\mu$m); CPWDP is the number of corner pads with a different pitch 230; CPP is the corner pad pitch 232 ($\mu$m); and IDPP is the input die pad pitch 240 ($\mu$m). The square bracket portion is truncated before being multiplied by 2.

The maximum number of wire bond connections for the die is calculated by multiplying the result from the preceding equation by 4.

Other calculations utilized in section 206 are as follows:

When the package post pads are staggered, an equation used to calculate the minimum die pad pitch 262 is:

$$2\left[\frac{MDEL \times 1000 - 2 \times MDCC - DPW - 2 \times (CPWDP - 1) \times CPP}{(TNWBC \div 4) - 1 - 2 \times (CPWDP - 1)}\right]$$

where:
MDEL is the minimum die edge length 214 (mm); MDCC is the minimum die corner clearance 228 (μm); DPW is the die pad width 226 (μm); CPWDP is the number of corner pads with a different pitch 230; CPP is the corner pad pitch 232 (μm); and TNWBC is the total number of wire bond connections 260.

Other calculations utilized in section 208 are as follows:
When the package post pads are staggered, an equation for calculating the maximum number of die pads allowed 290 is:

$$4 \times \left(2 \times \left[\frac{MDEL \times 1000 - 2 \times MDCC - DPW - 2 \times (CPWDP - 1) \times CPP}{IDPP}\right] + 2 \times (CPWDP - 1) + 1\right)$$

and wherein the result from the equation in square brackets is truncated; and
MDEL is the minimum die edge length 214 (mm); MDCC is the minimum die corner clearance 228 (μm); DPW is the die pad width 226 (μm); CPWDP is the number of corner pads with a different pitch 230; CPP is the corner pad pitch 232 (μm); and IDPP is the input die pad pitch (μm) 280.

When the package post pads are in-line and arranged circularly, an equation for calculating the required bond finger (pad) pitch 292 is:

$$\left(\frac{2\pi(MDEL \times 500 + MWL \times 25.4) - 4(TBW \times 25.4 + 3 \times BFGW)}{TNWBP}\right)$$

and where:
MDEL is the minimum die edge length 214 (mm); MWL is the maximum wire length 218 (mils); TBW is the tie bar width 222 (mils); BFGW is the bond finger gap width 224 (mils); and TNWBP is the total number of wire bond pads 282.

When the package post pads are staggered and arranged circularly, an equation for calculating the required bond finger (pad) pitch 292 is:

$$\left(\frac{2\pi(MDEL \times 500 + MWL \times 25.4) - 4(TBW \times 25.4 + 3 \times BFGW)}{(TNWBP \div 2)}\right)$$

and where:
MDEL is the minimum die edge length 214 (mm); MWL is the maximum wire length 218 (mils); TBW is the tie bar width 222 (mils); BFGW is the bond finger gap width 224 (mils); and TNWBP is the total number of wire bond pads 282.

When the package post pads are staggered and arranged conventionally, an equation for calculating the required bond finger (pad) pitch 292 is:

$$IDPP + \left(\frac{2 \times MWL \times 25.4 \times \operatorname{Sine}((\pi \times MWA) \div 180) + (CPWDP - 1) \times 2 \times CPP - IDPP - IDPP \times (CPWDP - 1) \times 2}{(TNWBP \div 8)}\right)$$

and where:
IDPP is the input die pad pitch 280 (μm); MWL is the maximum wire length 218 (mils); MWA is the maximum wire angle 216 (degrees); CPWDP is the number of corner pads with a different pitch 230; CPP is the corner pad pitch 232 (μm); and TNWBP is the total number of wire bond pads 282.

Computer Hardware Overview

Figure 9:
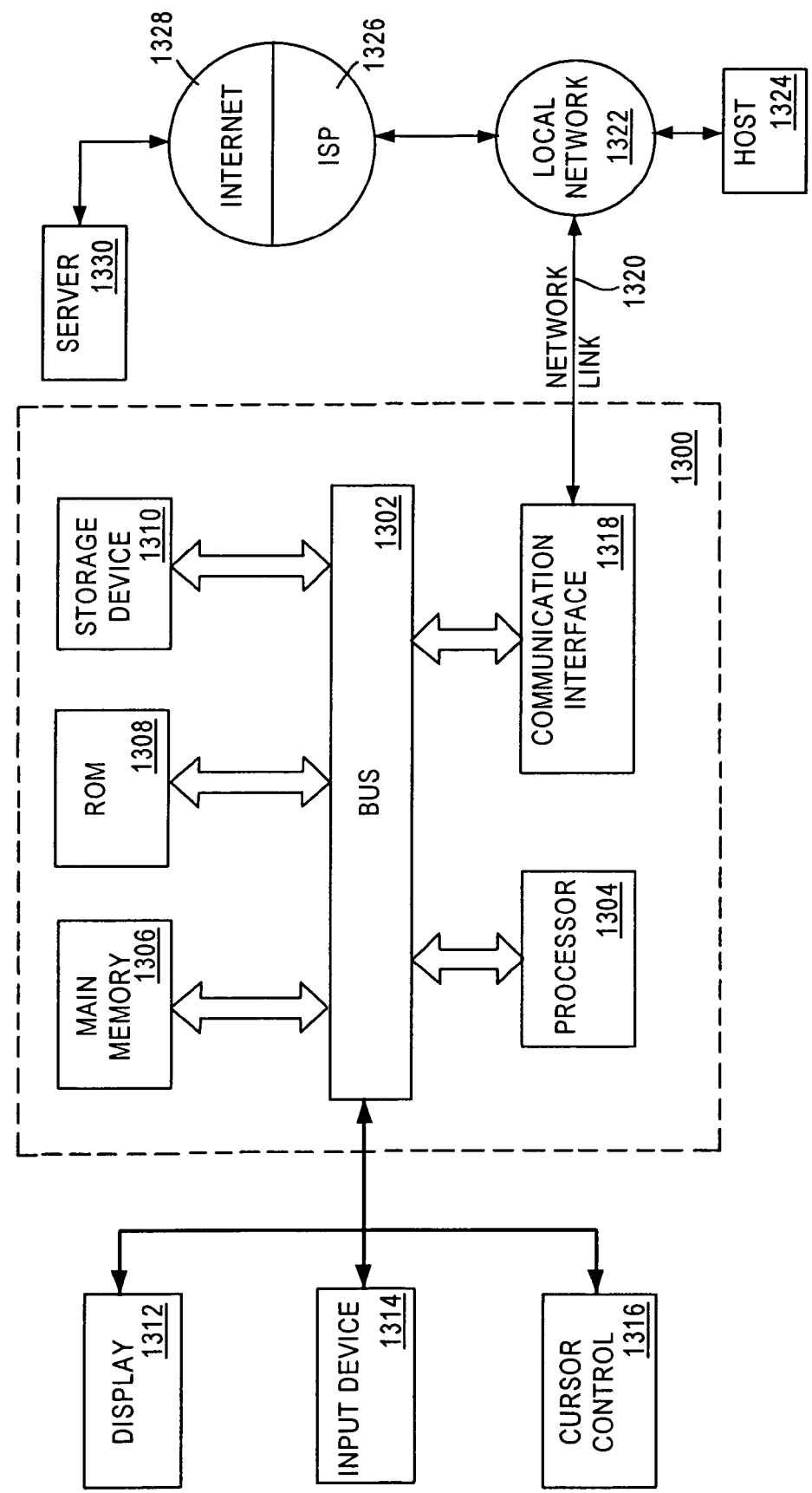
FIG. 9 depicts a computer system capable of implementing the present invention.

FIG. 9 is a block diagram that illustrates a computer system 1300 upon which an embodiment of the invention may be implemented. Computer system 1300 includes a bus 1302 or other communication mechanism for communicating information, and a processor 1304 coupled with bus 1302 for processing information. Computer system 1300 also includes a main memory 1306, such as a random access memory (RAM) or other dynamic storage device, coupled to bus 1302 for storing information and instructions to be executed by processor 1304. Main memory 1306 also may be used for storing temporary variables or other intermediate information during execution of instructions to be executed by processor 1304. Computer system 1300 further includes a read only memory (ROM) 1308 or other static storage device coupled to bus 1302 for storing static information and instructions for processor 1304. A storage device 1310, such as a magnetic disk or optical disk, is provided and coupled to bus 1302 for storing information and instructions.

Computer system 1300 may be coupled via bus 1302 to a display 1312, such as a cathode ray tube (CRT), for displaying information to a computer user. An input device 1314, including alphanumeric and other keys, is coupled to bus 1302 for communicating information and command selections to processor 1304. Another type of user input device is cursor control 1316, such as a mouse, a trackball, or cursor direction keys for communicating direction information and command selections to processor 1304 and for controlling cursor movement on display 1312. This input device typically has two degrees of freedom in two axes, a first axis (e.g., x) and a second axis (e.g., y), that allows the device to specify positions in a plane.

The invention is related to the use of computer system 1300 for determining whether a particular square die fits into a particular package. According to certain embodiments of the invention, determination whether a particular square die fits into a particular package is provided by computer system 1300 in response to processor 1304 executing one or more sequences of one or more instructions contained in main memory 1306. Such instructions may be read into main memory 1306 from another computer-readable medium, such as storage device 1310. Execution of the sequences of instructions contained in main memory 1306 causes processor 1304 to perform the process steps described herein. One or more processors in a multi-processing arrangement may also be employed to execute the sequences of instructions contained in main memory 1306. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1304 for execution. Such a medium may take many forms, including but not limited to, non-volatile media, volatile media, and transmission media. Non-volatile media include, for example, optical or magnetic disks, such as storage device 1310. Volatile media include dynamic memory, such as main memory 1306. Transmission media include coaxial cables, copper wire and fiber optics, including the wires that comprise bus 1302. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1304 for execution. For example, the instructions may initially be borne on a magnetic disk of a remote computer. The remote computer can load the instructions into its dynamic memory and send the instructions over a telephone line using a modem. A modem local to computer system 1300 can receive the data on the telephone line and use an infrared transmitter to convert the data to an infrared signal. An infrared detector coupled to bus 1302 can receive the data carried in the infrared signal and place the data on bus 1302. Bus 1302 carries the data to main memory 1306, from which processor 1304 retrieves and executes the instructions. The instructions received by main memory 1306 may optionally be stored on storage device 1310 either before or after execution by processor 1304.

Computer system 1300 also includes a communication interface 1318 coupled to bus 1302. Communication interface 1318 provides a two-way data communication coupling to a network link 1320 that is connected to a local network 1322. For example, communication interface 1318 may be an integrated services digital network (ISDN) card or a modem to provide a data communication connection to a corresponding type of telephone line. As another example, communication interface 1318 may be a local area network (LAN) card to provide a data communication connection to a compatible LAN. Wireless links may also be implemented. In any such implementation, communication interface 1318 sends and receives electrical, electromagnetic or optical signals that carry digital data streams representing various types of information. Network link 1320 typically provides data communication through one or more networks to other data devices. For example, network link 1320 may provide a connection through local network 1322 to a host computer 1324 or to data equipment operated by an Internet Service Provider (ISP) 1326. ISP 1326 in turn provides data communication services through the worldwide packet data communication network, now commonly referred to as the "Internet" 1328. Local network 1322 and Internet 1328 both use electrical, electromagnetic or optical signals that carry digital data streams. The signals through the various networks and the signals on network link 1320 and through communication interface 1318, which carry the digital data to and from computer system 1300, are exemplary forms of carrier waves transporting the information.

Computer system 1300 can send messages and receive data, including program code, through the network(s), network link 1320, and communication interface 1318. In the Internet example, a server 1330 might transmit a requested code for an application program through Internet 1328, ISP 1326, local network 1322 and communication interface 1318. In accordance with the invention, one such downloaded application provides for automatically creating lot numbers and product identification numbers for a residual lot as described herein.

The received code may be executed by processor 1304 as it is received, and/or stored in storage device 1310, or other non-volatile storage for later execution. In this manner, computer system 1300 may obtain application code in the form of a carrier wave.

The present invention may be embodied in a computer system as described above, or it may be a program designed to operate on any configuration for a computer system.

Embodiments of the present invention can therefore greatly decrease the amount of time required to design new integrated circuits and requires fewer and less expensive computing resources than currently employed, replacing the trial and error method of guessing package and corresponding die parameters, and generating a drawing based upon these guesses, with calculating die and/or package parameters and determining whether a die and package combination fit together. Thus, a die may be designed to fit a particular package, a package may be designed to fit a particular die, and simultaneous design of both a die and a package that fit one another may be accomplished. The number of drawings that must be generated is significantly reduced, and the total time to design a new integrated circuit is correspondingly reduced from several days.

While this invention has been described in connection with what is presently considered to the most practical and preferred embodiments, the invention is not limited to the disclosed embodiments, but on the contrary, is intended to cover various modifications and equivalent arrangements included within the spirit and scope of the appended claims.

What is claimed is:

1. A method for determining whether a square die fits into a particular package comprising the steps of:
  receiving input for one or more design parameters for the square die;
  calculating characteristics of the die based upon the design parameter; and
  comparing the calculated characteristics of the die to characteristics of the package, wherein, the package comprises a ball grid array (BGA) package;
  the one or more design parameters include a die pad pitch;
  calculating characteristics of the die includes:
  calculating a maximum number of die pads allowed based upon the die pad pitch; and
  calculating a required package bond finger pitch based upon the die pad pitch; and comparing the calculated characteristics of the die includes:
comparing the calculated required package bond finger pitch to a minimum predefined package bond finger pitch for the BGA package.

2. The method of claim 1, wherein calculating die characteristics comprises:
calculating a maximum number of wire bond connections per side of the die based upon the one or more design parameters;
calculating a maximum number of wire bond connections for the die based upon the maximum number of wire bond connections per side of the die; and
calculating a minimum die edge size based upon the one or more design parameters.

3. The method of claim 1 wherein:
the step of comparing the calculated, required package bond finger pitch to a minimum predefined package bond finger pitch for the package comprises:
rounding the calculated, required package bond finger pitch up to the nearest integer;
comparing the rounded, required package bond finger pitch to the minimum predefined package bond finger pitch; and
indicating that the die fits into the package if the rounded, required package bond finger pitch is greater than or equal to the minimum predefined package bond finger pitch.

4. The method of claim 1, further comprising the step of:
generating a drawing using the input die pad pitch, the calculated maximum number of wire bond connections for the die, the calculated minimum die edge size, the calculated maximum number of die pads allowed, and the calculated required package bond finger pitch to verify that the die fits into the BGA package.

5. The method of claim 1, wherein:
determining whether a particular square die fits into a particular BGA package is performed for package post pads that are staggered and arranged along an arc.

6. The method of claim 5, wherein:
calculating the maximum number of connections for a side of the die is performed by truncating the result from an equation:

$$2 \times \left( 2 \times PTR \times \text{ArcSin} \left[ \frac{2 \times MWL \times 25.4 \times \text{Sin}(\pi \times MWA) + 180) + (CPWDP - 1) \times 2 \times CPP - IBPP - IBPP \times (CPWDP - 1) \times 2}{(MPP - (MPP - GBDP) \times CTPG) - IBPP} \times \frac{MPP - (MPP - GBDP) \times CTPG}{2 \times PTR} \right] \right)$$
$$\overline{MPP - (MPP - GBDP) \times CTPG}$$

wherein:
IBPP is the input die bond pad pitch ($\mu$m);
PTR is the post tip radius relating to the pads on the package;
MWA is the maximum wire angle;
MWL is the maximum wire length;
MPP is the minimum post pitch;
GBDP is the gap between bonding points on power and ground rings;
CTPG is the percentage of connections from the die to the power and ground rings;
CPWDP is the number of corner pads with different pitch; and
CPP is the corner pad pitch.

7. The method of claim 5, wherein:
calculating the minimum die edge size is performed according to an equation:

$$\frac{2 \times MDCC + DPW + (CPWD - 1) \times 2 \times CPP + IBPP \times \frac{MNC - 2 \times CPWDP}{2}}{1000}$$

wherein:
MDCC is the minimum die corner clearance;
DPW is the die pad width;
CPP is the corner pad pitch;
CPWDP is the number of corner pads with a different pitch;
IBPP is the input die bond pad pitch; and
MNC is the maximum number of connections per side of the die.

8. The method of claim 5, wherein calculating the maximum total number of die pads allowed is performed according to an equation:

$$4 \times \left[ \frac{1000 \times DEL - 2 \times MDCC - DPW - (CPWDP - 1) \times 2 \times CPP}{DPP} \right] \times 2 + 2 \times (CPWDP - 1) + 1$$

wherein the portion in the square bracket is rounded to the nearest integer; and
DEL is the die edge length;
MDCC is the minimum die corner clearance;
DPW is the die pad width;
CPWDP is the number of corner pads with a different pitch;
CPP is the corner pad pitch; and
DPP is the die pad pitch.

9. The method of claim 5, wherein calculating the required package bond finger pitch is performed according to an equation:

$$2 \times \left( \frac{2 \times PTR \times \text{ArcSin}\left( \frac{2 \times MWL \times 25.4 \times \text{Sin}\left(\frac{\pi \times MWA}{180}\right) + \frac{(CPWDP-1) \times 2 \times CPP - DPP - DPP \times (CPWDP-1) \times 2}{(MPP-(MPP-GBDP) \times CTDP) - DPP} \times \frac{MPP - (MPP - GBDP) \times CTPG}{2 \times PTR}}{\frac{WBP}{4}} \right)}{1 - CTPG} \right) - GPDP \times CTPG$$

wherein:
PTR is the post tip radius;
DPP is the die pad pitch;
MWL is the maximum wire length;
MWA is the maximum wire angle;
CPWDP is the number of corner pads with a different pitch;
CPP is the corner pad pitch;
CTPG is the percentage of connections from the die to the power and ground rings;
MPP is the minimum post pitch for the post pads on the package;
GBDP is the gap between bonding points on the power and ground rings; and
WBP is the total number of bonded wire bond pads.

10. The method of claim 1, wherein:
determining whether a particular square die fits into a particular BGA package is performed for package post pads that are in-line and arranged along an arc.

11. The method of claim 1, wherein:
determining whether a particular square die fits into a particular BGA package is performed for package post pads that are staggered and arranged linearly.

12. The method of claim 1, wherein:
determining whether a particular square die fits into a particular BGA package is performed for package post pads that are in-line and arranged linearly.

13. A method for determining whether a square die fits into a particular package comprising the steps of:
receiving input for one or more design parameters for the square die;
calculating characteristics of the die based upon the design parameter; and
comparing the calculated characteristics of the die to characteristics of the package, wherein, the package comprises a ball grid array (BGA) package;
the one or more design parameters include a total number of wire bond connections;
calculating characteristics of the die includes:
calculating a maximum number of die pads allowed based upon the total number of wire bond connections; and
calculating a required package bond finger pitch based upon the total number of wire bond connections; and
comparing the calculated characteristics includes:
comparing the calculated required package bond finger pitch to a minimum predefined package bond finger pitch for the BGA package.

14. The method of claim 13, wherein calculating die characteristics comprises:
calculating a minimum die pad pitch based upon the one or more design parameters; and
calculating a minimum die edge size based upon the one or more design parameters.

15. A method for determining whether a square die fits into a particular package comprising the steps of:
receiving input for one or more design parameters for the square die:
calculating characteristics of the die based upon the design parameter; and
comparing the calculated characteristics of the die to characteristics of the package, wherein the package comprises a plastic quad flat package (PQFP) package;
the one or more design parameters include a die pad pitch;
calculating calculated characteristics of the die includes:
calculating a maximum number of die pads allowed based upon the die pad pitch; and
calculating a required package bond finger pitch based upon the die pad pitch; and
comparing the calculated characteristics includes:
comparing the calculated required package bond finger pitch to a minimum predefined package bond finger pitch for the PQFP package.

16. The method of claim 15, wherein calculating die characteristics comprises:
calculating a maximum number of wire bond connections per side of the die based upon the one or more design parameters; and
calculating a maximum number of wire bond connections for the die based upon the maximum number of wire bond connections per side of the die.

17. A method for determining whether a square die fits into a particular package comprising the steps of:
receiving input for one or more design parameters for the square die:
calculating characteristics of the die based upon the design parameter; and
comparing the calculated characteristics of the die to characteristics of the package, wherein, the package comprises a plastic quad flat package (PQFP) package;
the one or more design parameters include a total number of wire bond connections;
calculating characteristics of the die includes:
calculating a maximum number of die pads allowed based upon the total number of wire bond connections; and
calculating a required package bond finger pitch based upon the total number of wire bond connections; and
comparing the calculated characteristics includes:
comparing the calculated required package bond finger pitch to a minimum predefined package bond finger pitch for the PQFP package.

18. The method of claim 17, wherein calculating die characteristics comprises:
calculating a minimum die pad pitch based upon the one or more design parameters.

* * * * *